(12) United States Patent
Chao et al.

(10) Patent No.: US 9,252,757 B2
(45) Date of Patent: Feb. 2, 2016

(54) OSCILLATOR CIRCUIT WITH OUTPUT SLOPE PROPORTIONAL TO SUPPLY VOLTAGE

(71) Applicant: Analog Devices, Inc., Norwood, MA (US)

(72) Inventors: Hio Leong Chao, San Jose, CA (US); Lawrence H. Edelson, Fremont, CA (US)

(73) Assignee: Analog Devices, Inc., Norwood, MA (US)

( * ) Notice: Subject to any disclaimer, the term of this patent is extended or adjusted under 35 U.S.C. 154(b) by 75 days.

(21) Appl. No.: 13/948,970

(22) Filed: Jul. 23, 2013

(65) Prior Publication Data

US 2015/0028924 A1 Jan. 29, 2015

(51) Int. Cl.
  *H03K 4/90* (2006.01)
(52) U.S. Cl.
  CPC ........................................ *H03K 4/90* (2013.01)
(58) Field of Classification Search
  CPC ......... H03K 4/90; H03K 3/02; H03K 3/0231; H03K 3/353
  USPC ................... 323/271, 282; 331/111, 143, 153
  See application file for complete search history.

(56) References Cited

U.S. PATENT DOCUMENTS

| | | | | |
|---|---|---|---|---|
| 6,057,675 | A * | 5/2000 | Tateishi | 323/283 |
| 7,034,627 | B1 * | 4/2006 | Kudari | 331/143 |
| 7,843,279 | B2 * | 11/2010 | Chou et al. | 331/111 |
| 7,898,825 | B2 | 3/2011 | Mulligan et al. | |
| 2010/0141225 | A1 * | 6/2010 | Isham et al. | 323/282 |
| 2012/0062297 | A1 * | 3/2012 | Keaveney et al. | 327/159 |
| 2012/0268095 | A1 | 10/2012 | Wu | |
| 2013/0038310 | A1 * | 2/2013 | Menegoli et al. | 323/288 |

OTHER PUBLICATIONS

"Fundamentals of Phase Locked Loops (PLLs)", [Online]. Retrieved from the internet :<http://www.analog.com/static/imported-files/tutorials/MT-086.pdf>, (Accessed on Jul. 3, 2013), 10 pgs.

"High-Voltage, Step-Down Controller in TSOT6", [Online]. Retrieved from Internet: <http://www.zlgmcu.com/Sipex/datasheets/SP6127.pdf>, (Accesssed on Jul. 3, 2013), 12 pgs.

"LM5037 Dual-Mode PWM Controller With Alternating Outputs", Texas Instruments, [Online]. Retrieved from the internet: <http://www.ti.com/lit/ds/symlink/lm5037.pdf>., (Accessed Jun. 23, 2013), 30 pgs.

(Continued)

*Primary Examiner* — Jeffrey Shin
(74) *Attorney, Agent, or Firm* — Schwegman Lundberg & Woessner, P.A.

(57) ABSTRACT

A voltage-controlled oscillator (VCO) comprises a supply voltage node, configured to receive a supply voltage, a VCO output capacitor, configured to provide an oscillating output voltage across the capacitor, a discharge switch configured to discharge the capacitor according to an oscillation frequency of the oscillating output voltage, and a comparator circuit configured to provide, to a control terminal of the discharge switch, a control signal that is determined based on a comparison of the output voltage and a specified threshold voltage. The oscillating output voltage includes a pulse having a ramp slope that is determined as a function of a magnitude of the supply voltage, and is capable of being adjusted independently of the oscillation frequency.

20 Claims, 7 Drawing Sheets

(56) References Cited

OTHER PUBLICATIONS

"PLL Phase Locked Loop Tutorial", [Online]. Retrieved from the Internet: <http://www.radio-electronics.com/info/rf-technology-design/pll-synthesizers/phase-locked-loop-tutorial.php>, (Accessed on Jul. 3, 2013), 5 pgs.

"Thermoelectric Coller (TEC) Controller", [Online]. Retrieved from Internet: <http://www.analog.com/static/imported-files/data_sheets/ADN8831.pdf>, (Accessed on Jul. 3, 2013), 20 pgs.

"Translinear Circuits", [Online]. Retrieved from Internet <http://cas.ee.ic.ac.uk/people/dario/files/E416/translinear-lores.pdf>., (Accessed on Jul. 3, 2013), 22 pgs.

Arbetter, B., et al., "Feed-forward pulse-width modulators for switching power converters", 26th Annual IEEE Power Electronics Specialists Conference, 1995. PESC '95 Record., vol. 1, (1995), 601-607.

Kelkar, S. S, "A Novel Feedforward Compensation Canceling Input Filter-Regulator Interaction", IEEE Transactions on Aerospace and Electronic Systems, vol. AES-19, Issue: 2, (Mar. 1983), 258-268.

Marasco, Ken, "How to Apply DC-to-DC Step-Down (Buck) Regulators Successfully", Analog Dialogue 45-06 Back Burner, Jun. (2011), [Online]. Retrieved from the internet: <http://www.analog.com/library/analogdialogue/archives/45-06/buck_regulators.html>, (Accessed Jul. 3, 2013), 4 pgs.

Redl, R., et al., "Near-Optimum Dynamic Regulation of DC-DC Converters Using Feed-Forward of Output Current and Input Voltage with Current-Mode Control", IEEE Transactions on Power Electronics, vol. PE-1, Issue: 3, (Jul. 1986), 181-192.

Sjoroos, J. P, et al., "Dynamic performance of buck converter with input voltage feedforward control", 2005 European Conference on Power Electronics and Applications, (2005), 1-9.

Zhang, Zach, "Buck Converter Control Cookbook", [Online]. Retrieved from the Internet: <http://www.aosmd.com/res/application_notes/power-ics/PIC-003.pdf>, (Accessed on Jul. 3, 2013), 11 pgs.

\* cited by examiner

OSCILLATOR CIRCUIT WITH OUTPUT SLOPE PROPORTIONAL TO SUPPLY VOLTAGE

TECHNICAL FIELD

This document pertains generally, but not by way of limitation, to oscillator circuits.

BACKGROUND

An electronic oscillation circuit provides an oscillating electric output signal, often in response to a control signal that adjusts one or more characteristics of the oscillating electric output signal. An electronic oscillation circuit can include, for example, a voltage-controlled oscillator (VCO) circuit, or a current-controlled oscillator circuit. Oscillating electric output signal characteristics can include, among others, signal amplitude, frequency, or waveform morphology.

In an example, a voltage-controlled oscillator provides an oscillating electric output signal determined, at least in part, by a voltage control input signal. For instance, an amplitude of a voltage control input signal can correspond to a frequency of the oscillating electric output signal, and a change in the amplitude of the voltage control input signal can correspond to a change in the frequency of the oscillating electric output signal. In other examples, an electronic oscillation circuit can be controlled by a current control input signal, such that a change in the current control input signal corresponds to a change in the frequency of the oscillating electric output signal.

Some examples of signals that can be generated by electronic oscillation circuits include processor clock signals, signals configured for wired and wireless communications, system synchronization signals, and audio signals, among others. VCOs are used in control systems, such as in phase-locked loop (PLL) circuits. In an example, a PLL circuit includes a PLL output that is fed back to a PLL input, and a reference input. The PLL output signal has a phase that is generated using a VCO and is based on a comparison of a reference signal phase and the PLL output signal phase.

OVERVIEW

The present inventors have recognized, among other things, that a problem to be solved can include providing a voltage-controlled oscillator (VCO) circuit with a pulse ramp output having a ramp slope that is proportional to the VCO supply voltage. The present subject matter can help provide a solution to this problem, such as using: a VCO output capacitor, configured to provide an oscillating output voltage across the capacitor; a discharge switch, coupled in parallel with the capacitor, the discharge switch configured to discharge the capacitor according to an oscillation frequency of the oscillating output voltage; and a first comparator circuit, configured to provide, to a control terminal of the discharge switch, a control signal that is determined based on a comparison of the output voltage and a specified threshold voltage. In an example, the specified threshold voltage and the output voltage are proportional to the supply voltage, the ramp slope is proportional to the supply voltage, and the oscillation period is independent of the supply voltage.

In an example, a system comprising the VCO circuit includes a supply voltage node, configured to receive a supply voltage, and a power converter forward path, including first and second switches, an inductor, and a first capacitor, wherein each of the first and second switches is controllably coupled to a respective driver circuit, wherein the first switch is coupled to the supply voltage node, and wherein a system output voltage is provided using the first capacitor. The system can include a feedback path comprising a pulse signal generator, and first and second comparator circuits. The pulse signal generator can include a phase detector and the VCO, wherein the VCO is configured to generate an oscillating output voltage comprising a pulse train, and the pulse train comprises pulses having ramp slopes that are determined as a function of a magnitude of the supply voltage, and the output oscillates at a frequency determined by a signal from a phase detector. The first comparator circuit is operable to provide an error voltage signal based on a comparison of a reference voltage and the system output voltage, and the second comparator circuit is operable to provide a control signal to the respective driver circuits based on a comparison of the error voltage signal and the output of the pulse signal generator. In an example, the system is a buck converter.

Operating the VCO circuit can include, among other things, some or all of the steps including providing a first current to or from a supply through first and second circuit legs, generating a ramped pulse signal across a capacitor in the second circuit leg using a portion of the first current, providing a threshold voltage across a resistor in the first circuit leg using a portion of the first current, and controllably discharging the ramped pulse signal from the capacitor in response to a comparison of the capacitor voltage and the threshold voltage, wherein the ramped pulse signal is generated as a pulse having a slope that is a function of a value of the capacitor, of a value of the resistor, and of a voltage of the supply.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
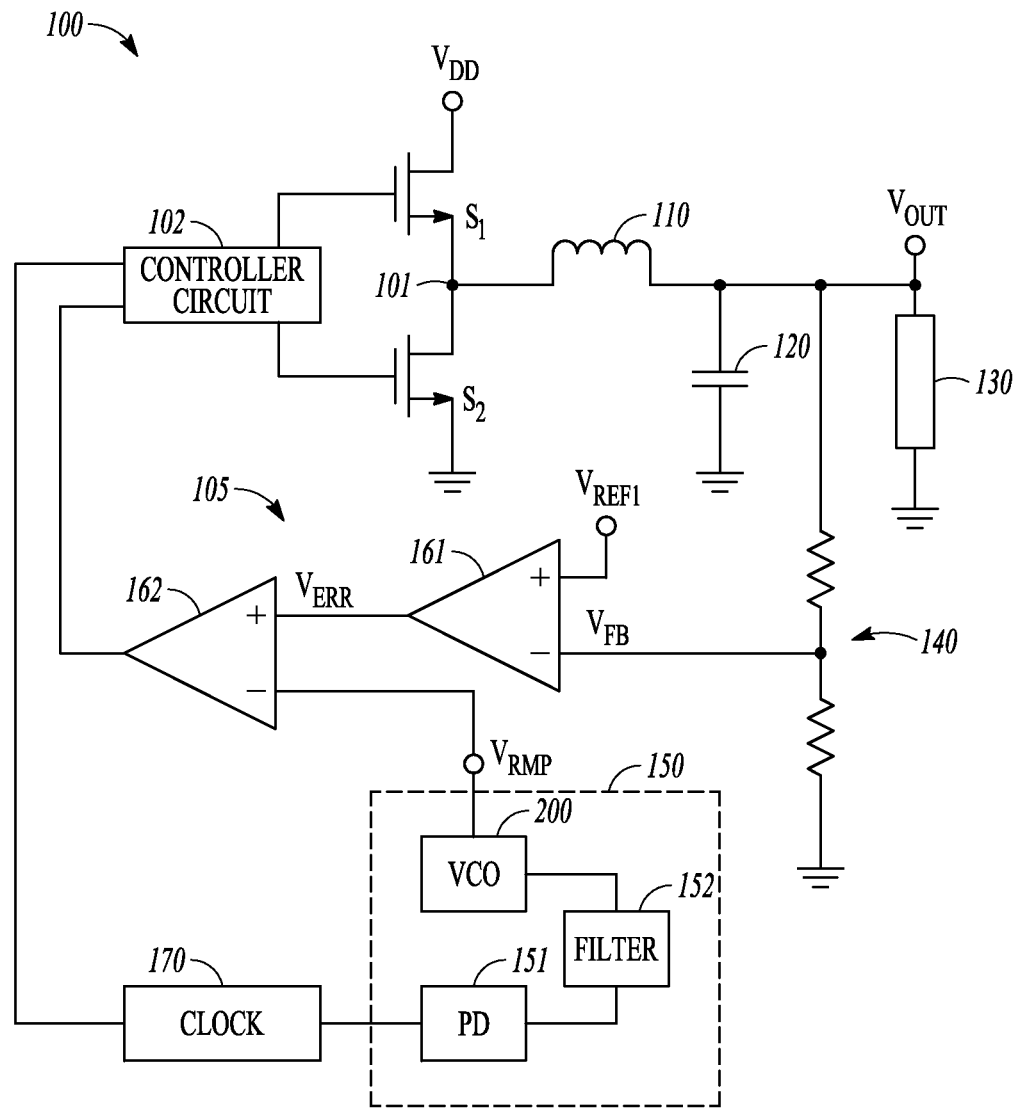
FIG. 1 illustrates generally an example of a switching voltage converter system.

FIG. 1 illustrates generally an example of a switching voltage converter system 100. The converter system 100 is configured as a buck converter, however, the circuits and methods described herein are similarly applicable to other switching converter topologies. The converter system 100 includes a feedback circuit 105 that includes a phase-locked loop (PLL) circuit 150, and the PLL circuit 150 includes a voltage-controlled oscillator (VCO) circuit. The VCO circuit provides a pulse ramp output signal having a ramp slope that is proportional to the supply voltage of the VCO circuit and, optionally, is proportional to the supply voltage of the converter system 100.

The converter system 100 includes first and second switches $S_1$ and $S_2$ coupled at a switching node 101. An energy-storing inductor 110 is coupled between the switching node 101 and a converter output node. In the example of FIG. 1, the converter output node provides a converter output signal $V_{OUT}$, such as to an output load 130 (e.g., a resistive load). The inductor 110 receives, via the first and second switches $S_1$ and $S_2$, respectively, first and second currents according to respective duty cycles D and D'. The first and second currents charge an energy storage element, such as a capacitor 120 that is coupled to the converter output node.

The first and second switches $S_1$ and $S_2$ are switched to control the converter output signal $V_{OUT}$ in response to respective switching signals received from a controller circuit 102. The controller circuit 102 generates the switching signals using information about the converter output signal from the feedback circuit 105. The controller circuit 102 can be configured to operate the switches in various modes, such as a pulse-width modulation (PWM) mode and a pulse-skip (or pulse-frequency) mode. In a PWM mode, the frequency at which the first and second switches $S_1$ and $S_2$ are switched is constant and the pulse width, or on-time, of the switches is adjusted to vary the voltage at the converter output node. In the PWM mode, the average power delivered from the converter system 100 is proportional to the duty cycle, D, of the switches. In a pulse-skip mode, the first and second switches $S_1$ and $S_2$ are both open to disable, or skip, switching. In the pulse-skip mode, the voltage and current available at the converter output node are functions of the energy stored by the capacitor 120.

In the example of FIG. 1, the second switch $S_2$ is coupled between the switching node 101 and ground, and the first switch $S_1$ is coupled between the switching node 101 and a supply input node. In operation of the converter system 100, during a first clock period, the second switch $S_2$ is switched off and the first switch $S_1$ is switched on to raise the switching node 101 to approximately a supply voltage $V_{DD}$ at the supply input node (e.g., when $V_{DD}$ is greater than a threshold voltage of the first switch $S_1$, such as a $V_{GS}$ threshold voltage when the switch is a MOS device), and a rising current flows through the inductor 110. During a subsequent second clock period, the first switch $S_1$ is switched off and the second switch $S_2$ is switched on to pull the switching node 101 to approximately a ground voltage level. A falling current then flows from the inductor 110. Throughout both clock periods, the capacitor 120 provides an output current $I_{OUT}$ to the load 130. These rising and falling currents provide the converter output signal $V_{OUT}$. The duration of the first and second clock periods is adjusted by the controller circuit 102 to establish duty cycles D and D' for the first and second switches $S_1$ and $S_2$, respectively, to provide or maintain a particular converter output voltage at the converter output node.

The converter output signal $V_{OUT}$ is processed by the feedback circuit 105, and information about $V_{OUT}$ is provided to the controller circuit 102 to update the converter duty cycle. In the example of FIG. 1, the feedback circuit 105 includes a resistive divider 140, a first amplifier 161, and a second amplifier 162. The resistive divider 140 is configured to provide a feedback voltage, $V_{FB}$, that is proportional to the converter output voltage at $V_{OUT}$. The first amplifier 161 is a differential amplifier that provides an error voltage signal $V_{ERR}$ based on a comparison of the feedback voltage $V_{FB}$ and a reference voltage, $V_{REF1}$. In an example, the error voltage signal $V_{ERR}$ can be processed or filtered to enhance stability of the feedback loop.

The second amplifier 162 is a differential amplifier that provides a control signal to the controller circuit 102. The error voltage signal $V_{ERR}$ is applied to the non-inverting input of the second amplifier 162, and a voltage ramp signal, $V_{RMP}$, is applied to the inverting input of the second amplifier 162. In an example, $V_{RMP}$ is a fixed voltage ramp that provides a PWM signal to the controller circuit 102. In response to the PWM signal, the controller circuit 102 provides signals to the first and second switches $S_1$ and $S_2$ according to the duty cycle determined in part by the error voltage $V_{ERR}$. In this manner, the first and second switches $S_1$ and $S_2$ pass respective currents in different portions of each period of the PWM signal and maintain the feedback voltage $V_{FB}$ at a level that is similar to the reference voltage $V_{REF1}$. The converter output voltage $V_{OUT}$ is thereby maintained substantially constant regardless of the output current. In some examples, the converter system 100 includes further circuitry, such as a current feedback loop, to supplement the feedback circuit 105 and to address changes in $V_{DD}$.

The converter system 100 optionally includes a phase-locked loop (PLL) circuit 150. The PLL circuit 150 includes a phase detector circuit 151, a voltage-controlled oscillator (VCO) circuit 200, and a filter 152. The PLL circuit 150 is configured to receive a reference signal from a clock source 170 and provide the voltage ramp signal $V_{RMP}$ from the VCO circuit 200. A first input node of the phase detector circuit 151 is configured to receive the reference signal from the clock source 170, and a second input node of the phase detector circuit 151 is coupled to the VCO circuit 200 using a feedback loop. The phase detector circuit 151 compares the phase of $V_{RMP}$ with the phase of the reference signal and generates a phase error signal according to the phase difference between the two signals.

An output node of the phase detector circuit 151 is coupled to an input node of the filter 152, and an output node of the filter 152 is coupled to an input node of the VCO circuit 200 to provide a VCO control signal to the VCO circuit 200. In an example, the filter 152 filters the phase error signal from the phase detector circuit 151 to remove extraneous components of the phase detector output signal and to convert the signal into a voltage that can be used as the VCO control signal. The VCO control signal can be used to adjust one or more characteristics of the VCO circuit 200, such as an oscillating frequency of the VCO output signal. Because of the PLL feedback loop, the phase detector circuit 151 and the filter 152 will continuously update based on the VCO output signal until the phase error is minimized, such as when the VCO output signal frequency is synchronized with the reference signal frequency.

Figure 2:
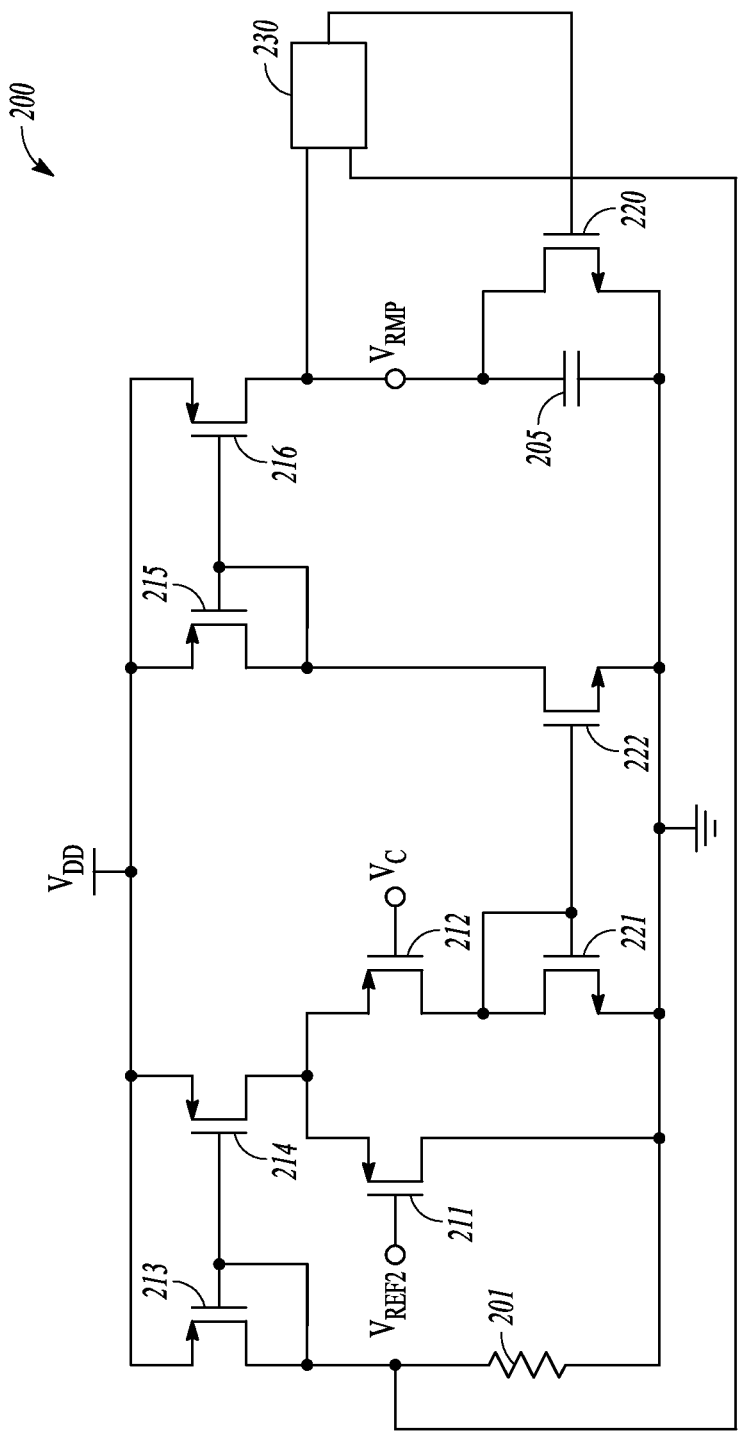
FIG. 2 illustrates generally an example of a voltage-controlled oscillator circuit.

FIG. 2 illustrates generally an example of the VCO circuit 200. The VCO circuit 200 is configured to provide a voltage ramp signal $V_{RMP}$, such as can be provided to the phase detector circuit 151 of the converter system 100. In some examples, the VCO circuit 200 provides the voltage ramp signal $V_{RMP}$ as an oscillating signal comprising multiple pulses. One or more of the multiple pulses can include a ramp portion having a slope that is proportional to the supply voltage $V_{DD}$. In some examples, the VCO circuit 200 provides the oscillating signal at a frequency that is independent of the supply voltage $V_{DD}$.

The slope of a ramp portion of a $V_{RMP}$ pulse can be increased or decreased according to fluctuations in $V_{DD}$. In some examples, the VCO circuit 200 provides the oscillating output voltage in a voltage feed forward configuration. That is, the VCO circuit 200 provides the oscillating output voltage without using a feedback loop to tune or update the pulse slopes. In some examples, the supply voltage for the VCO circuit 200 is received from a node that is coupled to the same supply input node as the converter system 100 (e.g., to receive the supply voltage $V_{DD}$). Accordingly, the VCO circuit 200 provides the output signal $V_{RMP}$ as a signal comprising pulses with ramp slopes that are proportional to $V_{DD}$.

The example VCO circuit 200 in FIG. 2 includes a circuit network configured to generate the VCO output voltage across an output capacitor 205, and a comparator circuit 230 configured to switchably discharge the output capacitor 205 to provide the oscillating output voltage $V_{RMP}$. The VCO circuit 200 includes a differential pair of p-type transistors comprising a first p-type transistor 211 and a second p-type transistor 212, configured to receive the VCO control signal and update the oscillating frequency of the VCO. The VCO circuit 200 further includes a first current mirror comprising a diode-connected third p-type transistor 213 and a fourth p-type transistor 214 in the mirror's respective current legs. In an example, the differential pair of transistors is configured to meter the current in the first current mirror, and thereby adjust the charging current applied to the output capacitor 205.

The first current mirror is coupled to the supply input node, and the leg of the first current mirror that includes the fourth p-type transistor 214 supplies current to source nodes of the differential pair. The gate of the first p-type transistor 211 is coupled to a reference voltage biasing node (e.g., to receive a second reference voltage $V_{REF2}$), and the gate of the second p-type transistor is coupled to a voltage control node (e.g., to receive the VCO control signal $V_C$). The reference voltage biasing node is used to center the operating range of the voltage control node over a specified operating range.

In the first current mirror, the third p-type transistor 213 mirrors the current from the fourth p-type transistor 214, and the drain of the third p-type transistor 213 is coupled to a first resistor 201. The biasing current through the third p-type transistor 213 is expressed as:

$$I_{d,213} = \frac{V_{DD} - V_{GS,213}}{R_{201}} \quad (1)$$

In an example, the biasing current $I_{d,213}$ indirectly provides a reference voltage based on the voltage across the first resistor 201, and the reference voltage is used by the comparator circuit 230 to update the duty cycle at which the output capacitor 205 is discharged.

In the example of FIG. 2, the current in the third p-type transistor 213 is mirrored to a sixth p-type transistor 216 by way of a network of current mirrors. For example, the current in the third p-type transistor 213 is mirrored by the fourth p-type transistor 214 and provided, at least partially, to a diode-connected first n-type transistor 221 via the differential pair of transistors. The current in the first n-type transistor 221 can be mirrored to a second n-type transistor 222. The current in the second n-type transistor 222 can bias a fifth p-type transistor 215, whose current can be mirrored to the sixth p-type transistor 216. A drain of the sixth p-type transistor 216 can be coupled to the output capacitor 205. In an example where the mirroring ratios for the n-type and p-type mirrors are 1:1, the drain current in the third p-type transistor 213 can be substantially equal to the drain current in the sixth p-type transistor 216. In an example, the mirroring ratios are not 1:1, and the drain current in the sixth p-type transistor 216 differs from the drain current in the third p-type transistor 213 by a scaling factor $\gamma$:

$$I_{d,216} = \gamma \cdot I_{d,213} \quad (2)$$
$$= \gamma \cdot \frac{V_{DD} - V_{GS,213}}{R_{201}}$$

The constant $\gamma$ indicates the overall mirroring ratio from the current through the third p-type transistor 213 to the drain current in the sixth p-type transistor 216 that flows into the output capacitor 205. In the example of FIG. 2, $I_{d,216}$ is proportional to the difference between the supply voltage $V_{DD}$ and the gate-to-source voltage of the third p-type transistor $V_{GS,213}$, as shown by Equation (2).

In an example, the VCO output signal $V_{RMP}$ develops across the output capacitor 205 according to the current through the sixth p-type transistor 216. A discharge switch 220 can be coupled across the output capacitor 205 to controllably shunt the output capacitor 205 voltage to circuit ground, such as according to a control signal from the comparator circuit 230. In an example, the discharge switch 220 is a transistor with a gate configured to receive the control signal from the comparator circuit 230.

The comparator circuit 230 is configured to provide the discharge control signal based on a comparison of the output capacitor 205 voltage and a threshold voltage. In an example, the comparator circuit 230 identifies the threshold voltage based on a measured voltage in the VCO circuit 200, receives the threshold voltage from an external source, or uses a specified or predetermined threshold voltage, such as one stored in the comparator circuit 230. In the example of FIG. 2, the threshold voltage can be a measured voltage across the first resistor 201. The voltage across the first resistor 201 depends on the supply voltage $V_{DD}$ and the gate-to-source voltage of the third p-type transistor 213, $V_{GS,213}$.

In an example where the VCO output signal $V_{RMP}$ oscillates at a fixed frequency, the gate of the first p-type transistor 211 can be tied high (e.g., the input reference signal $V_{REF2}$ is greater than $V_{GS,211}$) and the gate of the second p-type transistor 212 can be tied low (e.g., the VCO control signal $V_c$ is less than $V_{GS,212}$). Biased in this manner, substantially all of the current flowing through the fourth p-type transistor 214 also flows through the second p-type transistor 212. At an initial time $t_0$, the initial voltage across the output capacitor 205 is about 0 V. The discharge switch 220 is in an open state such that the voltage across the output capacitor 205 is not shunted to the circuit ground and the output capacitor 205 charges. In this example, the drain current in the sixth p-type transistor 216 flows into the output capacitor 205 and the voltage ramp signal $V_{RMP}$ increases, or ramps up. The slope of the pulse ramp is the rate of change of the voltage across the output capacitor 205, which is determined in part by the drain current of the third p-type transistor according to:

$$\text{SLOPE} = \frac{dV_{RMP}}{dt} = \frac{I_{d,213}}{C_{220}} = \gamma \frac{V_{DD} - V_{GS,213}}{C_{220} R_{201}} \quad (3)$$

The slope of the ramp portion is thus proportional to $V_{DD}$-$V_{GS,213}$. The constant γ from Equation (2) indicates the overall mirroring ratio from the current through the third p-type transistor 213 to the drain current in the sixth p-type transistor 216 that flows into the output capacitor 205. Combining Equations (2) and (3), when the supply voltage $V_{DD}$ is large relative to the threshold voltage of the transistors, the slope is approximated as:

$$\text{SLOPE} \approx \gamma \frac{V_{DD}}{C_{220} R_{201}} \quad (4)$$

When the voltage magnitude of $V_{RMP}$ is, for example, substantially the same voltage magnitude as the threshold voltage (e.g., the measured voltage across the first resistor 201), the comparator circuit 230 can provide a signal to the discharge switch 220 to shunt the output capacitor 205 voltage to ground. That is, as the voltage of the output capacitor 205 approaches or exceeds the threshold voltage, the output capacitor 205 is discharged. Once the voltage of the output capacitor 205 is diminished, the comparator circuit 230 can update the signal to the discharge switch 220 to remove the shunt path such that the output capacitor 205 can be charged again.

In an example, the threshold voltage used by the comparator circuit 230 is the voltage across the first resistor 201. This threshold voltage is the difference between the supply voltage $V_{DD}$ and the gate-to-source voltage $V_{GS,213}$ of the third p-type transistor 213. The threshold voltage is proportional to $V_{DD}$-$V_{GS,213}$. When the threshold voltage and the output capacitor 205 charging current are each proportional to $V_{DD}$-$V_{GS,213}$, the oscillation frequency or ramp period of $V_{RMP}$ is independent of the supply voltage. The voltage across the output capacitor 205 is the oscillating output voltage $V_{RMP}$ and has a pulse period given by:

$$T = \frac{C_{205} V_{R_{201}}}{I_{d,216}} = \frac{C_{205}(V_{DD} - V_{GS,213})}{I_{d,216}} \quad (5)$$

In an example where the mirroring ratios for the n-type and p-type mirrors are 1:1, the drain current in the third p-type transistor 213 is substantially equal to the drain current in the sixth p-type transistor 216. Substituting the expression for $I_{d,216}$ from Equation (2) into Equation (5), the oscillation period is:

$$T = C_{205} R_{201} \quad (6)$$

That is, the oscillation period is proportional to the capacitance of the output capacitor 205 and the resistance of the resistor 201, and the oscillation period is independent of the supply voltage $V_{DD}$ and the threshold voltages of the transistors in the VCO circuit 200.

The oscillating output voltage $V_{RMP}$ from the VCO circuit 200 thus comprises pulses having slopes that depend on the supply voltage $V_{DD}$, the passive resistor, and the passive capacitor of the VCO circuit 200. The slope of the VCO output signal is therefore independent of any circuit that may receive the VCO output signal (e.g., the converter system 100 of FIG. 1). In FIG. 1, the converter system 100 operates in a feed forward manner because a change in $V_{DD}$ can be addressed by the VCO, such as without using information from the converter system 100 output. The output signal from the VCO circuit 200 is influenced by $V_{DD}$, and, in an example, the oscillating output voltage $V_{RMP}$ from the VCO circuit 200 is used in the feedback circuit 105 of the converter system 100 to provide a control signal to the controller circuit 102.

Figure 3:
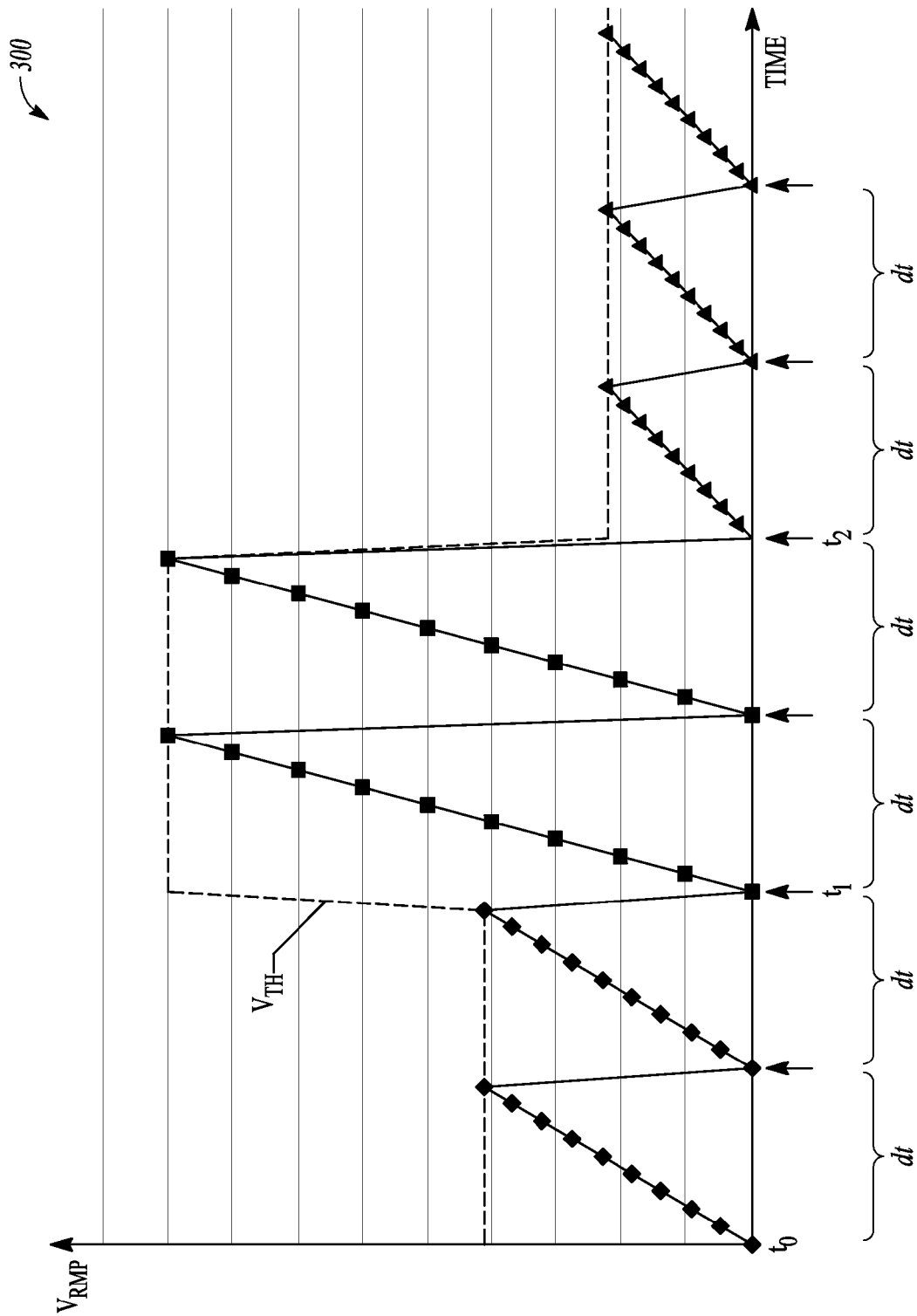
FIG. 3 illustrates generally an example of an oscillator output voltage ramp signal.

FIG. 3 illustrates generally an example 300 of the oscillating output voltage $V_{RMP}$ from the VCO circuit 200. In the example of FIG. 3, at an initial time $t_0$, $V_{RMP}$ is 0 V. $V_{TH}$ indicates the threshold voltage and, in the example of FIG. 2, $V_{TH}$ is the voltage across the first resistor 201 (e.g., $V_{DD}$-$V_{GS,213}$), and is supply-dependent. Accordingly, as the supply voltage $V_{DD}$ fluctuates, so too does the threshold voltage.

The current charging the output capacitor 205 changes as a function of time, and the current can be expressed as:

$$I_{d,216} = C_{205} \frac{dV}{dt} \quad (7)$$

Equation (7) is an alternative to the expression in Equation (2) of the current at the output capacitor 205. The slope of the voltage across the output capacitor 205 is represented by the change in the voltage with time, or dV/dt. Substituting the expression for the output capacitor 205 charging current $I_{d,216}$ from Equation (2) into Equation (7), the expression for the change in time, dt, is:

$$dt = dV \frac{C_{205}}{I_{d,216}} = (V_{DD} - V_{GS,213}) \frac{C_{205} R_{201}}{(V_{DD} - V_{GS,213})} = C_{205} R_{201} \quad (8)$$

Thus, as similarly provided in Equation (6), the oscillating output period dt is independent of the supply voltage $V_{DD}$. In the example of FIG. 3, the discharge switch 220 is activated by the comparator circuit 230 at the expiration of each period dt, as indicated by the vertical arrows below the time axis. Activating the discharge switch 220 shunts the output capacitor 205 to ground and resets the oscillation cycle.

In the example of FIG. 3, the supply voltage $V_{DD}$ changes at $t_1$ and $t_2$. $V_{TH}$ tracks the changes in $V_{DD}$. Because the oscillation period is independent of changes in $V_{DD}$, the slope of $V_{RMP}$ changes to accommodate a change in $V_{DD}$. For example, at $t_1$, $V_{DD}$ is increased, $V_{TH}$ is increased, and the slope of $V_{RMP}$ is increased. Similarly, at $t_2$, $V_{DD}$ is decreased, $V_{TH}$ is decreased, and the slope of $V_{RMP}$ is decreased. Thus, the slope of $V_{RMP}$ is proportional to $V_{DD}$ even as the oscillating frequency is unchanged.

Referring again to FIG. 2, the frequency of the VCO output signal $V_{RMP}$ can be varied in response to a VCO control signal. For example, the frequency of the output signal of the VCO circuit 200 is adjustable based on an input voltage signal at node $V_C$ in FIG. 2. In an example, the frequency adjustment is based on a variable resistance, such as a voltage-controlled resistor. In the example of FIG. 2, the differential pair of first and second p-type transistors 211 and 212 provides such a controlled resistance. Assuming the voltages at the gates of the first and second p-type transistors 211 and 212 are equal and of sufficient magnitude for both transistors to be forward biased, the first and second p-type transistors 211 and 212 will have the same VGS voltage, and each of the first and second p-type transistors 211 and 212 will conduct half of the drain current $I_{d,214}$ from the fourth p-type transistor 214. In this example, the current in the sixth p-type transistor 216 is reduced, and the output capacitor 205 takes about twice as long to charge up to the threshold voltage set by the resistor 201. The output frequency is reduced as well since it takes more time to charge the output capacitor 205 when less current is provided to it.

When the first and second p-type transistors 211 and 212 are unequally biased, the drain current of the sixth p-type transistor is given by:

$$I_{d,216} = \frac{I_{d,213}}{\alpha} = \frac{V_{DD} - V_{GS,213}}{\alpha \cdot R_{201}} \quad (9)$$

where α is the ratio of the drain currents in the fourth p-type transistor 214 and the second p-type transistor 212:

$$\alpha = \frac{I_{d,214}}{I_{d,212}} \quad (10)$$

The quantity α is a function of the voltage difference between $V_{REF2}$ and $V_C$. For example, when $V_C$ is less than $V_{REF2}$, more current from the fourth p-type transistor 214 is steered toward the second p-type transistor 212, and α decreases. Conversely, when $V_C$ is greater than $V_{REF2}$, more current is steered toward the first p-type transistor 211, and a increases. The quantity α has a minimum value of 1, which indicates substantially all of the drain current from the fourth p-type transistor 214 flows into the second p-type transistor 212.

The VCO oscillation frequency depends on a. For example, substituting the expression for $I_{d,216}$ from Equation (9) into Equation (5) provides:

$$T = \frac{C_{205}(V_{DD} - V_{GS,213})(\alpha \cdot R_{201})}{(V_{DD} - V_{GS,213})} = \alpha \cdot C_{205} R_{201} \quad (11)$$

Thus, the ratio of the drain currents affects the oscillation frequency of the VCO circuit 200, while the oscillation frequency remains supply-independent.

However, α can be somewhat supply dependent when the first and second p-type transistors 211 and 212 are MOS transistors. To reduce the supply dependency and improve the accuracy of α, the first and second p-type transistors can be replaced with first and second bipolar transistors. The first and second bipolar transistors provide a translinear circuit that exploits the linear relationship between collector current and transconductance in the bipolar transistors, and makes a substantially supply independent. In another example to reduce the supply dependency and improve the accuracy of α, the first and second p-type transistors 211 and 212 can be operated in a sub-threshold (weak inversion) region by increasing the physical width of the transistors. When the transistors operate in the sub-threshold region, they behave similarly to bipolar transistors. In another example, if the accuracy of α is not critical and a more linear relationship is desired between the VCO control signal $V_C$ and the VCO oscillating frequency, the first and second p-type transistors 211 and 212 can be long channel devices.

Equations (3) and (4) indicate the slope of the VCO output voltage signal $V_{RMP}$ is substantially proportional to the supply voltage $V_{DD}$ when $V_{GS,213}$ is small relative to the supply voltage $V_{DD}$. However, when the supply voltage magnitude approaches $V_{GS,213}$, the VCO circuit 200 can operate improperly or unpredictably. In this case, the operation of the VCO circuit 200 can be adjusted using a voltage-controlled current circuit, such as shown in the example of FIG. 4.

Figure 4:
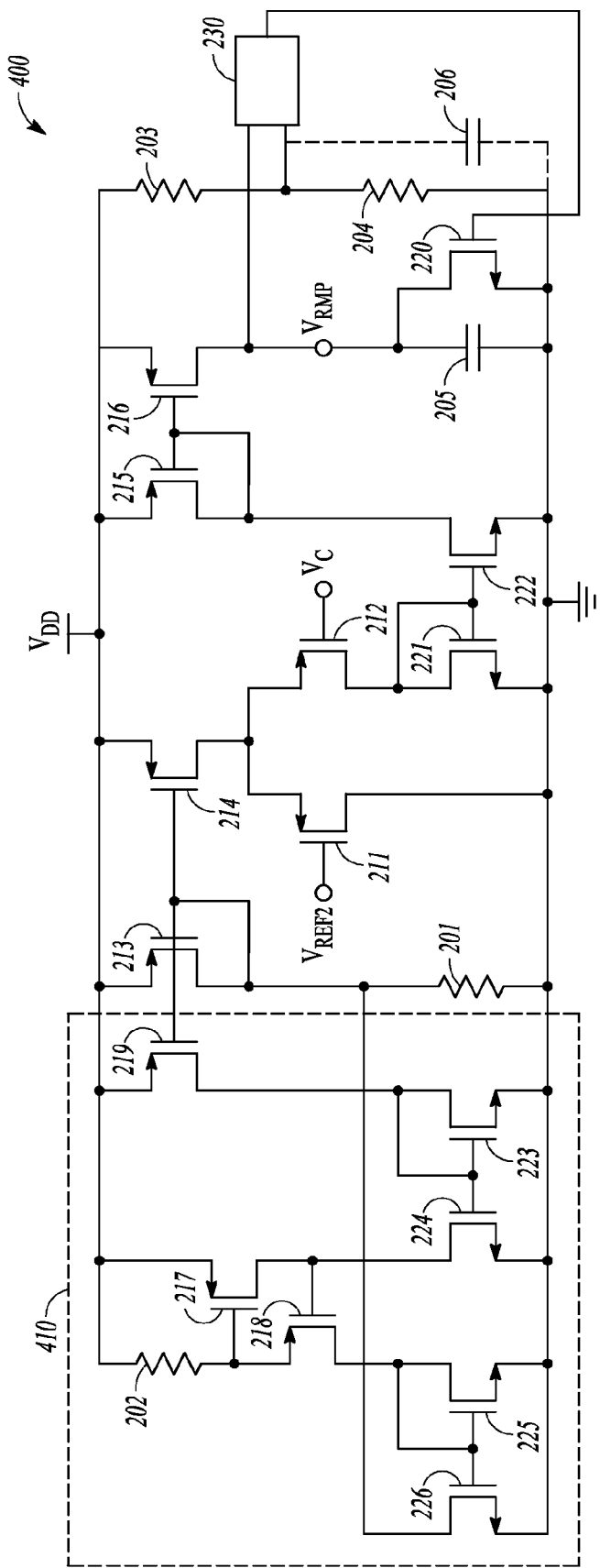
FIG. 4 illustrates generally an example of a voltage-controlled oscillator circuit.

FIG. 4 illustrates generally an example of a second VCO circuit 400. The VCO circuit 400 includes several of the same circuit elements as described above in the discussion of the VCO circuit 200, and these elements are designated with the same numerals as used above in the discussion of FIG. 2. The VCO circuit 400 includes a voltage-controlled current circuit 410 configured to increase the current $I_{d,213}$ drawn through the third p-type transistor 213 to maintain $I_{d,213}$ proportional to the voltage supply $V_{DD}$, such as when the magnitude of the supply voltage drops to a low level.

Referring again to Equation (1), the drain current $I_{d,213}$ of the third p-type transistor 213 is a function of the supply voltage $V_{DD}$, the gate-to-source voltage of the transistor $V_{GS,213}$, and the resistance of the resistor 201. The drain current $I_{d,213}$ can be made more closely proportional to the supply voltage $V_{DD}$ using the voltage-controlled current circuit 410 to increase the current through the third p-type transistor 213 by an amount that is approximately equal to the gate-to-source voltage divided by the resistance of the resistor 201.

In the example of FIG. 4, the voltage-controlled current circuit 410 includes third and fourth n-type transistors 223 and 224 arranged in a current mirror configuration, and fifth and sixth n-type transistors 225 and 226 arranged in a current mirror configuration. The voltage-controlled current circuit 410 further includes seventh, eighth, and ninth p-type transistors 217, 218, and 219. The ninth p-type transistor 219 is arranged to mirror the current through the third p-type transistor 213. The drain current in the third p-type transistor 213, $I_{d,213}$, is mirrored to the fourth n-type transistor 224 by way of transistors 223 and 219. The fifth p-type transistor 225 is configured to drive the gate of the seventh p-type transistor and a second resistor 202, to balance the drain current $I_{d,217}$ in the seventh n-type transistor 217. The resulting current through the eighth p-type transistor 218 is mirrored using the current mirror comprising the fifth and sixth n-type transistors 225 and 226 to increase the total current drawn from the supply node through the third p-type transistor 213.

In an example, the gate-to-source voltages of the third and fourth p-type transistors 213 and 214 are the same, and the first and second resistors 201 and 202 provide the same resistance. Accordingly, the drain current in the eighth p-type transistor 218 is given by:

$$I_{d,218} = \frac{V_{GS,217}}{R_{202}} = \frac{V_{GS,213}}{R_{201}} \quad (12)$$

The drain current $I_{d,218}$ is mirrored through the current mirror comprising the fifth and sixth n-type transistors 225 and 226, and thereby increases the total current drawn from the supply node through the third p-type transistor 213. In this manner, the magnitude of the drain current $I_{d,213}$ in the VCO circuit 400 of FIG. 4 exceeds the drain current $I_{d,213}$ in the VCO circuit 200 of FIG. 2.

Due to the voltage-controlled current circuit 410, the current that charges the capacitor 205 (i.e., $I_{d,216}$) increases as the drain current $I_{d,213}$ increases. Although the drain current $I_{d,213}$ remains proportional to the supply voltage $V_{DD}$, for example due to the voltage-controlled current circuit 410, the current through the first resistor 201 may not always be proportional to the supply voltage $V_{DD}$. Accordingly, when the voltage-controlled current circuit 410 is used, the voltage across the first resistor 201 is not reliably proportional to the supply voltage $V_{DD}$, and the voltage across the first resistor 201 should not be used as the threshold voltage by the comparator circuit 230 if the oscillating frequency is to be supply-independent.

However, the operating frequency of the VCO circuit 400 can be made supply independent when the threshold voltage used by comparator circuit 230 to control the discharge switch 220 is proportional to the supply voltage $V_{DD}$. As described above in the discussion of FIG. 2, the operating frequency of the VCO circuit 200 can be supply independent because both the threshold voltage $V_{TH}$ and the output capacitor 205 charging current are proportional to the same $V_{DD}$-$V_{GS,213}$ voltage. In the example of FIG. 4, however, while the voltage across the first resistor 201 remains proportional to $V_{DD}$-$V_{GS,213}$, the elevated drain current $I_{d,216}$ makes the output capacitor charging current proportional to $V_{DD}$.

Instead of using the voltage across the first resistor 201 as the threshold voltage (i.e., $V_{DD}$-$V_{GS,213}$), the threshold voltage can be determined using a resistive divider comprising third and fourth resistors 203 and 204. The resistive divider can be coupled to the supply node of the VCO circuit 400 to receive the supply voltage $V_{DD}$. The threshold voltage used by the comparator circuit 230 can be received from a tap node between the third and fourth resistors 203 and 204. Because the resistances of the third and fourth resistors 203 and 204 are fixed, the tap node remains substantially proportional to the supply voltage $V_{DD}$ over an expected operating range of $V_{DD}$.

The oscillation period is affected by the resistance ratio in the resistive divider because the threshold voltage is determined by the resistance ratio. In an example that includes a changing supply voltage $V_{DD}$ level, the threshold voltage $V_{TH}$ can change almost instantaneously with the supply voltage $V_{DD}$ level change. However, the slope of the output capacitor charging ramp also changes. This change in output frequency is apparent as a phase error (e.g., in the PLL circuit 150), which can be corrected over subsequent oscillation cycles. When the supply voltage level change is brief, the phase error can be compensated in part using a filtering capacitor 206 coupled across a portion of the resistive divider.

For example, suppose the supply voltage $V_{DD}$ doubles during a particular cycle. The threshold voltage $V_{TH}$ can rapidly track the supply voltage $V_{DD}$ change using the resistive divider. Additionally, the slope of the output capacitor 205 charging ramp changes from the time of the supply voltage $V_{DD}$ change to the end of the cycle. The cycle length can be increased due to the increased threshold voltage $V_{TH}$. In the cycle(s) where the voltage supply $V_{DD}$ transient occurs, the output frequency 1/T can be different than a steady state frequency, for example, because the output capacitor 205 may charge at a slower rate before the supply voltage $V_{DD}$ increase than after the increase.

In another example, the supply voltage $V_{DD}$ is halved in the middle of a cycle. The threshold voltage $V_{TH}$ can again rapidly track the supply voltage $V_{DD}$ change, and the slope of the output capacitor 205 charging ramp will change. In an example, the change in the threshold voltage $V_{TH}$, in either case of the supply voltage $V_{DD}$ increase or decrease, can be slowed to compensate for the timing error and suppress the phase error. The filtering capacitor 206 can be provided across the fourth resistor 204 in the resistive divider to slow changes at the tap node by acting as a low pass filter.

Figure 5:
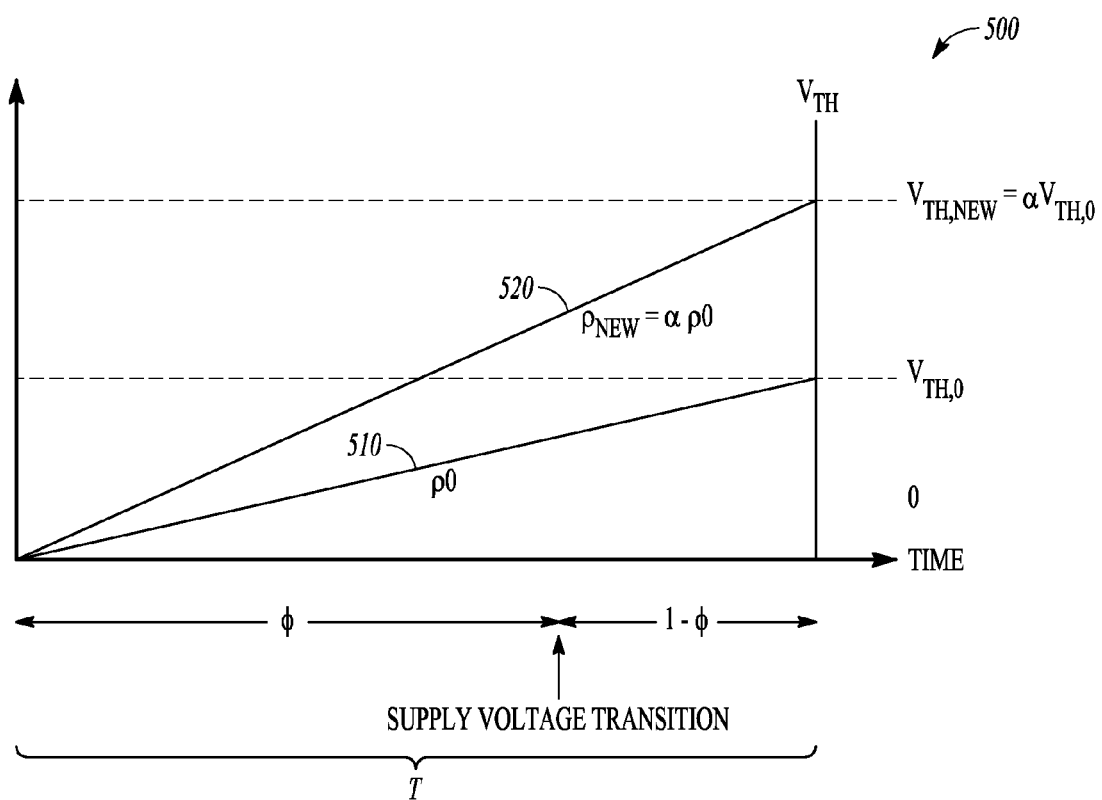
FIG. 5 illustrates generally an example of a threshold voltage change.

FIG. 5 illustrates generally an example 500 that includes a threshold voltage change in response to a supply voltage change. The example 500 includes an initial threshold voltage, $V_{TH,0}$, corresponding to an initial supply voltage, and a subsequent threshold voltage, $V_{TH,NEW}$, corresponding to a different supply voltage. Further included in the example 500 are theoretical voltage ramp signals, including an initial voltage ramp signal 510 corresponding to an initial ramp rate $\rho_0$, and a subsequent voltage ramp signal 520 corresponding to a subsequent ramp rate $\rho_{NEW}$. The example 500 shows the ramp signals 510 and 520 having a cycle period T.

Referring again to the VCO circuit 200 shown in FIG. 2, a change in an initial supply voltage, such as to twice the initial supply voltage (e.g., a change from $V_{DD}$ to $2V_{DD}$), can occur at some time $\delta t$ prior to the end of a cycle (i.e., before the period duration T elapses). The supply voltage change affects the threshold voltage used by the comparator circuit 230 to initiate discharge of the output capacitor 205, as discussed above in the discussion of FIG. 2.

In an example, the subsequent threshold voltage, $V_{TH,NEW}$, can increase to twice the initial threshold voltage, or $2V_{TH,0}$. The ramp rate $\rho$ will similarly increase by a factor of two when the supply voltage doubles. However, without further compensation, the remaining interval at of the period T will increase to another interval $\Delta t$, and can produce an error in the cycle duration. In the following cycle, however, this error can be disregarded because the ratio of the new threshold voltage and new ramp rate remains fixed. When a supply voltage change occurs in-phase with the period T, the VCO circuit 200 maintains the same period without the need for additional compensation circuitry.

In an example, a supply voltage for the VCO circuit 200 can double at time T/2. In this example, $\delta t$ is T/2. A voltage $\delta V$, considered a residual voltage, represents a voltage difference between the voltage ramp signal magnitude and the threshold voltage. As described above, when the supply voltage doubles, the threshold voltage also doubles. For example, $V_{TH,NEW}=2V_{TH,0}$. In this example, after time T/2, $\delta V$ increases in response to the supply voltage increase to yield $\delta V_{NEW}$:

$$\delta V_{NEW} = \frac{V_{TH,0}}{2} + (V_{TH,NEW} - V_{TH,0}) = \frac{3}{2} V_{TH,0} \qquad (13)$$

The ramp rate similarly increases by a factor of two when the supply voltage doubles. The new residual interval is thus given by:

$$\delta t_{NEW} = \frac{\frac{3}{2} V_{TH,0}}{2\rho_0} = \frac{3}{2} \frac{T}{2} \qquad (14)$$

To correct this interval, the slew rate of $V_{TH}$ can be restricted. For example, the VCO circuit 400 from the example of FIG. 4 includes the filter capacitor 206 to help restrict the slew rate of $V_{TH}$.

The slew rate after the supply voltage change should be $(V_{TH,NEW}-V_{TH,0})/T$ to maintain a cycle period T. The filter capacitor 206 can be provided, as in the example of the VCO circuit 400, at the node where the threshold voltage is obtained. In some examples, the value of the filter capacitor 206 can be selected as a function of the period T, and the resistances of the resistors 203 and 204 of the resistive divider in the VCO circuit 400. For example, the value of the filter capacitor 206 can be selected to satisfy the relationship:

$$C_{206} = T \frac{R_{204}}{R_{203}} (R_{203} + R_{204}) \qquad (15)$$

Referring again to FIG. 5, in an example, the supply voltage can change by a factor $\alpha$ at time $\phi T$. That is, $V_{DD}$ can be the initial supply voltage, and $\alpha V_{DD}$ can be the subsequent supply voltage. In response to the supply voltage change, the ramp rate can be updated from an initial ramp rate $\rho_0$ to $\alpha\rho_0$, and the threshold voltage can be updated from an initial threshold voltage $V_{TH,0}$ to $\alpha V_{TH,0}$. As shown in the example of FIG. 5, the remaining period at the time of the supply voltage transition can be $(1-\phi)T$. In an example, to maintain the same period T even after the supply voltage transition, the new ramp rate $\alpha\rho_o$ can be applied from the time $\phi T$ for the remaining period $(1-\phi)T$. The position of the slewed voltage, $V_{TH,\phi}$, at the end of the period is given by $(1-\phi)T\alpha\rho+\phi V_{TH,0}$, which, in some examples, may not coincide with $V_{TH,NEW}$ until a subsequent cycle. When $\phi$ is 0, $V_{TH,NEW}=\alpha V_{TH,0}$, and when $\phi$ is 1, $V_{TH,NEW}=V_{TH,0}$. The slew rate, $\sigma$, can thus be independent of $\phi$, as given by:

$$\sigma = \frac{(1-\phi)T(\alpha\rho_0) + \phi V_{TH,0} - V_{TH,0}}{(1-\phi)T} = (\alpha-1)\rho_0 \quad (16)$$

In the example VCO circuit 400, when the resistive divider is stabilized, the current available at the filter capacitor 206 is $(V_{DD}-V_{TH,0})/R_{203}$. After a supply voltage change, an excess current at the time of the supply voltage change is $(\alpha V_{DD}-V_{DD})/R_{203}$, and the resulting slew rate $\sigma$ is:

$$\sigma = \frac{\alpha V_{DD} - V_{DD}}{R_{203}C_{206}} = \frac{V_{DD}(\alpha-1)}{R_{203}C_{206}} \quad (17)$$

Equating Equations (16) and (17), and recalling the relationships $\rho_0=V_{TH,0}/T$, and $V_{TH,0}=V_{DD,0}(R_{203}/(R_{203}+R_{204}))$, the expression in Equation (15) for $C_{206}$ can be provided by solving the following for $C_{206}$:

$$\frac{V_{DD,0}(\alpha-1)}{R_{203}C_{206}} = \rho_0(\alpha-1) = \frac{(\alpha-1)V_{DD,0}}{T} \frac{R_{203}}{R_{203}+R_{204}} \quad (18)$$

Thus, a value for the filter capacitor 206 can be obtained as a function of the period and of the resistances of the resistive divider in the VCO circuit 400. The value for the filter capacitor 206, such as given by Equation (15), can provide a capacitance correction that can be used in the VCO circuit 400 to compensate for changes in the supply voltage $V_{DD}$ by modifying a voltage ramp slew rate.

The effective time constant for the slew between $V_{TH,0}$ and $V_{TH,NEW}$ can be expressed as $R_\parallel C_{206}$, where $R_\parallel$ is the parallel combination of $R_{203}$ and $R_{204}$. Referring again to Equation (16), an initial slew rate, $\sigma_0$, can thus be expressed as $V_{TH,0}(\alpha-1)/R_\parallel C_{206}$. In some examples, therefore, a change in the supply voltage $V_{DD}$ that is applied at the onset of a new cycle produces a change in the final threshold voltage by a factor of $(1/e)(\alpha V_{TH,0})$, which accordingly decreases the threshold voltage-dependent period. However, this threshold error can be compensated, such as using comparator circuits and a second resistive divider to adjust the slew rate.

Figure 6:
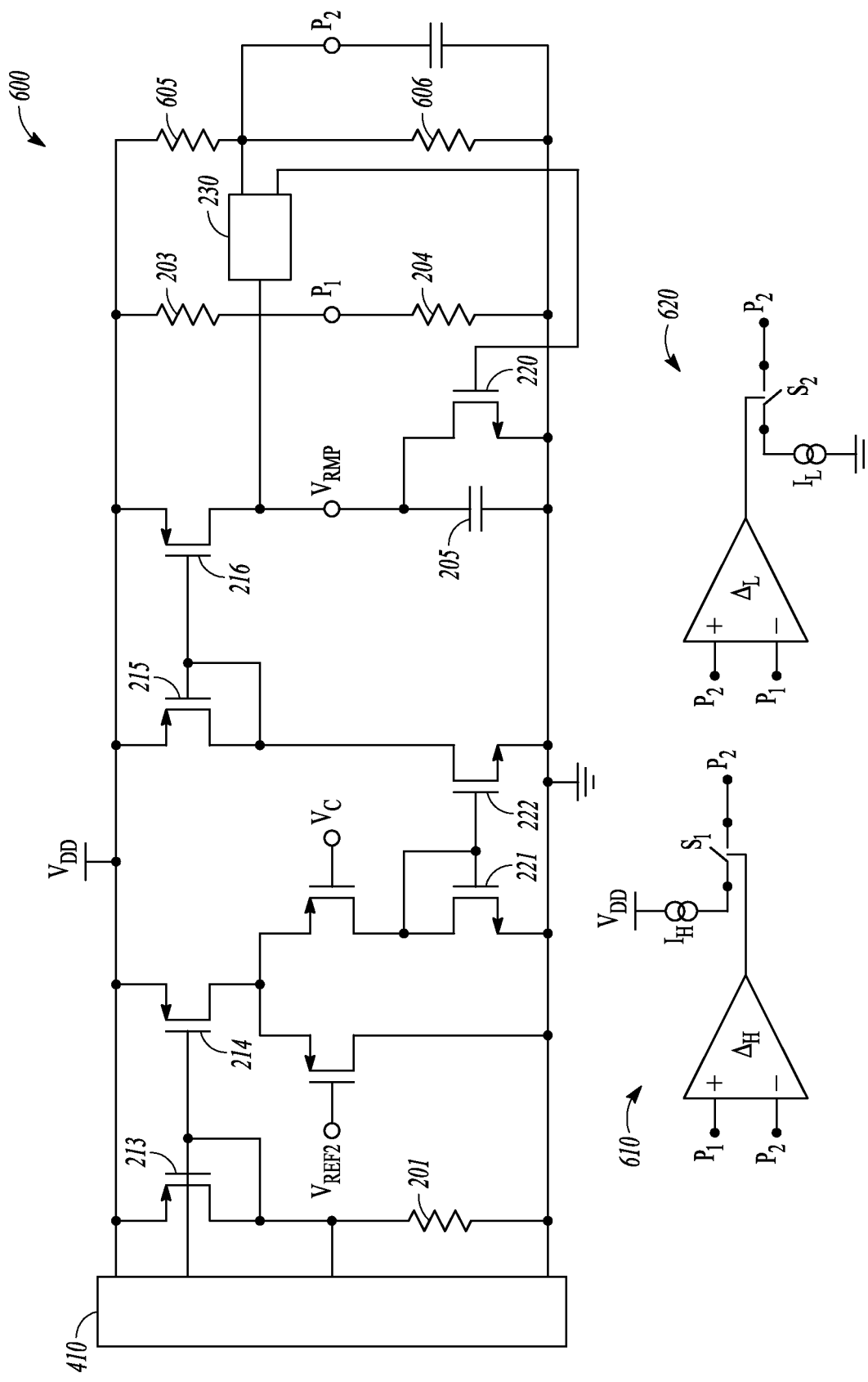
FIG. 6 illustrates generally an example of a voltage-controlled oscillator circuit with comparator circuits configured to adjust a slew rate.

FIG. 6 illustrates generally an example of a third VCO circuit 600 with comparator circuits configured to adjust a slew rate. The third VCO circuit 600 includes several of the same circuit elements as described above in the discussion of the VCO circuit 200 and the VCO circuit 400, and these elements are designated with the same numerals as used above. The third VCO circuit 600 can compensate for the above-mentioned threshold error by providing a more linear slew rate using the filter capacitor 206.

The third VCO circuit 600 includes a second resistive divider comprising fifth and sixth resistors 605 and 606. The resistive divider can be coupled to the supply node of the third VCO circuit 600 to receive the supply voltage $V_{DD}$. The fifth resistor 605 can be proportional to the third resistor 203 by a factor $\Gamma$, and the sixth resistor 606 can be proportional to the fourth resistor 204 by the same factor $\Gamma$ such that the divider ratio of the respective resistive divider networks is the same. In an example, the factor $\Gamma$ is large and the divider current through the second resistive divider is small.

The third VCO circuit 600 includes a first tap node $P_1$ between the third and fourth resistors 203 and 204, and a second tap node $P_2$ between the fifth and sixth resistors 605 and 606. In an example, the threshold voltage used by the comparator circuit 230 can be received from the second tap node $P_2$. Because the resistances of the fifth and sixth resistors 605 and 606 are fixed, the tap node remains substantially proportional to the supply voltage $V_{DD}$ over an expected operating range of $V_{DD}$.

The third VCO circuit 600 can include a current source module 610, such as a constant DC current source, configured to source current to the filter capacitor 206. In an example, a current source $I_H$ is switchably coupled to the second tap node $P_2$ using a first switch $S_1$. The first switch $S_1$ is driven by a comparator circuit $\Delta_H$, and the comparator circuit $\Delta_H$ is coupled to the first and second tap nodes $P_1$ and $P_2$ and respective non-inverting and inverting inputs. In an example, $I_H$ is configured to provide a constant current equal to the supply voltage $V_{DD}$ divided by the series combination of the third and fourth resistors 203 and 204. That is, $I_H=V_{DD}/(R_{203}+R_{204})$. In an example, when the supply voltage $V_{DD}$ increases (e.g., $\alpha>1$), the comparator circuit $\Delta_H$ provides a control signal to the first switch $S_1$ that couples the current source $I_H$ to the second tap node $P_2$ to charge the filter capacitor 206.

The third VCO circuit 600 can include a current sink module 620, such as a constant DC current sink, configured to sink current from the filter capacitor 206. In an example, a current sink $I_L$ is switchably coupled to the second tap node $P_2$ using a second switch $S_2$. The second switch $S_2$ is driven by a comparator circuit $\Delta_L$, and the comparator circuit $\Delta_L$ is coupled to the first and second tap nodes $P_1$ and $P_2$ and respective inverting and non-inverting inputs. In an example, $I_L$ is configured to sink a constant current equal to the supply voltage $V_{DD}$ divided by the series combination of the third and fourth resistors 203 and 204. That is, $I_L=I_H$. In an example, when the supply voltage $V_{DD}$ decreases (e.g., $\alpha<1$), the comparator circuit $\Delta_L$ provides a control signal to the second switch $S_2$ that couples the current sink $I_L$ to the second tap node $P_2$ to sink current from, or discharge, the filter capacitor 206.

The current source module 610 and the current sink module 620 can be used to configure the third VCO circuit 600 to generate an approximately linear slew rate in the filter capacitor 206. For example, a slew error in the example of the third VCO circuit 600 can be based on the divider current through the second resistive divider (e.g., determined at least in part by the factor $\Gamma$), such as can be a smaller current than provided through the resistive divider comprising the third and fourth resistors 203 and 204. In an example, when the voltage at the filter capacitor 206 is approximately equal to the voltage at the second tap point $P_2$, the current provided or sunk using the modules 610 and 620 can be switched off. In an example, the comparators $\Delta H$ and $\Delta L$ can be tunable hysteretic comparators configured to avoid actuation for an insignificant change in the supply voltage $V_{DD}$ (e.g., a change in $V_{DD}$ by less than a specified threshold amount).

Figure 7:
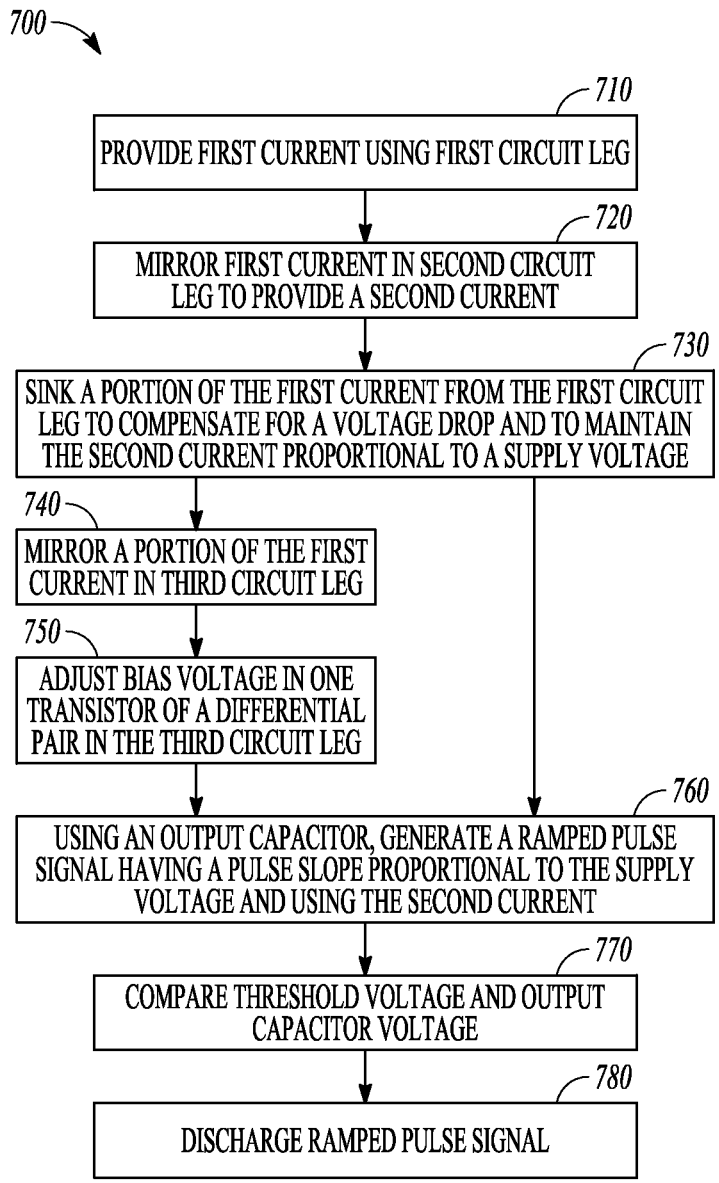
FIG. 7 illustrates generally an example that can include generating, using a VCO, a ramped pulse signal having a pulse slope that is proportional to a supply voltage.

Referring now to FIG. 7, an example of a method 700 includes generating, using a VCO circuit, a ramped pulse signal having a pulse slope that is proportional to a supply voltage. At 710, the method 700 includes providing a first current using a first circuit leg. The first current can be provided from or to a supply node that is coupled to multiple circuit legs (e.g., circuit paths between the supply node and a circuit reference or ground). The first current can be provided using a fixed or variable current or voltage source. In some examples, the first current is provided from a supply node that supplies current or voltage to one or more other circuits or circuit elements. For instance, the supply node can be configured to supply a current to an output stage of a power converter, such as shown in the example of FIG. 1.

At 720, the first current can be mirrored from the first circuit leg to a second circuit leg. The current can be mirrored directly (e.g., using a single pair of transistors configured as a current mirror), or indirectly, using one or more intervening current mirrors or other circuit elements. For example, referring to the VCO circuit 200 of FIG. 2, a current $I_{d,213}$ can be mirrored to the circuit leg comprising the sixth p-type transistor 216 to generate an output voltage across the output capacitor 205. The mirroring is accomplished via several current mirrors, including the current mirror comprising the third and fourth p-type transistors 213 and 214, the current mirror comprising the first and second n-type transistors 221 and 222, and the current mirror comprising the fifth and sixth p-type transistors 215 and 216.

In an example, the current mirrored from the first circuit leg to the second circuit leg can be proportional to a voltage at the supply node. At 730, a portion of the first current from the first circuit leg can be sunk to maintain the second current at a level that is proportional to the supply voltage. For example, the voltage-controlled current circuit 410 can be provided, as in the example of FIG. 4, to increase the current through the third p-type transistor 213 (by an amount that is approximately equal to the gate-to-source voltage of the third p-type transistor 213 divided by the resistance of the resistor 201) such that the current in the second circuit leg is proportional to the voltage at the supply node, even at low voltage supply levels.

At 740, a portion of the first current in the first circuit leg can be mirrored in a third circuit leg. The portion of the first current mirrored in the third circuit leg can be used to adjust an operating frequency of the VCO. In some examples without the third circuit leg, the circuit is a fixed-frequency oscillator. The current in the third circuit leg can flow through a variable resistance, such as a voltage-controlled variable resistance provided by, for example, a differential pair of transistors.

At 750, a bias voltage in one of the transistors in the differential pair can be adjusted to update a frequency of the VCO. Adjusting the bias voltage can include maintaining one transistor gate voltage at a constant voltage while adjusting the transistor gate voltage of the other transistor. For example, the gate maintained at the constant voltage level can set an operating level of the differential pair, while the other gate voltage can control an oscillating frequency of the VCO.

At 760, an output capacitor can be charged (e.g., the output capacitor 205 of FIGS. 2 and 4). The output capacitor can be charged using the current in the second circuit leg, which can be adjusted using one or more current mirrors (e.g., by adjusting physical characteristics of the mirroring devices, or transistors, such as channel width or doping density, to adjust a current mirror ratio) or using the differential pair of transistors described above at 750. The output capacitor voltage can be generated as a ramped pulse signal having a pulse slope that is proportional to the supply voltage when the current in the second circuit leg is proportional to the supply voltage. The output capacitor can be controllably discharged, such as using a shunting switch controlled by a comparator circuit (e.g., the comparator circuit 230).

At 770, a threshold voltage can be provided to the comparator circuit. In some examples, the threshold voltage is a fixed or variable portion of the supply voltage. For example, the threshold voltage can be provided from a tap node in a resistive divider that is coupled to the supply node. In some examples, the threshold voltage is specified, or the threshold voltage is provided based on a voltage in one of the circuit legs, such as a voltage developed across a passive resistance in one of the circuit legs.

At 770, the voltage across the output capacitor can be monitored using the comparator circuit. The output capacitor voltage and the threshold voltage can be compared. At 780, when the output capacitor voltage is equal to all or a specified portion of the threshold voltage, the comparator circuit can provide a control signal to the discharge switch to discharge the output capacitor. When the output capacitor is discharged (e.g., fully or partially), the comparator circuit can update the discharge switch (e.g., open the switch) such that the output capacitor can charge over a new cycle. As the output capacitor is repeatedly charged and discharged, an oscillating output voltage comprising multiple pulses can be provided, and the pulses can have ramp portions with slopes that are proportional to the supply voltage.

VARIOUS NOTES & EXAMPLES

Example 1 can include or use subject matter (such as an apparatus, a method, a means for performing acts, or a device readable medium including instructions that, when performed by the device, can cause the device to perform acts), such as can include or use an output capacitor to provide an oscillating output voltage ramp pulse having a slope that is determined as a function of a magnitude of a supply voltage. Example 1 can include, among other things, a voltage-controlled oscillator (VCO), comprising a supply voltage node, configured to receive a supply voltage, and a VCO output capacitor, configured to provide an oscillating output voltage across the capacitor. The VCO can include a discharge switch, coupled in parallel with the capacitor, and configured to discharge the capacitor according to an oscillation frequency of the oscillating output voltage. The VCO can include a first comparator circuit that is configured to provide, to a control terminal of the discharge switch, a control signal that is determined based on a comparison of the output voltage and a specified threshold voltage. In Example 1, the oscillating output voltage includes a ramp pulse having a ramp slope that is determined as a function of a magnitude of the supply voltage and that is capable of being adjusted independently of the oscillation frequency.

Example 2 can include, or can optionally be combined with the subject matter of Example 1, to optionally include the VCO, comprising a resistor providing the specified threshold voltage across the resistor, wherein the first comparator circuit is configured to compare the specified threshold voltage to the output voltage to operate the discharge switch to determine the output voltage slope as a function of the magnitude of the supply voltage, of a resistance of the resistor, and of a capacitance of the capacitor.

Example 3 can include, or can optionally be combined with the subject matter of one or any combination of Examples 1 or 2 to optionally include a voltage level shift circuit configured to receive the supply voltage and provide the specified threshold voltage referenced to and level-shifted from the supply voltage.

Example 4 can include, or can optionally be combined with the subject matter of Example 3, to optionally include, in the voltage level shift circuit, a diode-connected transistor.

Example 5 can include, or can optionally be combined with the subject matter of one or any combination of Examples 1 through 4 to optionally include a differential pair of transistors configured with respective inputs arranged to compare an oscillation frequency control input voltage to a reference voltage, wherein the differential pair is configured to directly or indirectly provide a current to the capacitor to affect the oscillation frequency.

Example 6 can include, or can optionally be combined with the subject matter of Example 5, to optionally include a current source/sink, configured to source or sink current to commonly connected source terminals of the differential pair of transistors, wherein a ratio of current provided in the current source/sink to a current provided to the capacitor determines the oscillation frequency.

Example 7 can include, or can optionally be combined with the subject matter of one or any combination of Examples 5 or 6 to optionally include a feedback circuit that includes the VCO, the feedback circuit including an input node coupled to receive and detect a frequency of the oscillating output voltage of the VCO, a frequency-to-voltage converter circuit, configured to provide the oscillation frequency control input voltage determined based on the detected frequency of the oscillating output voltage and a reference frequency, and an output node coupled to provide the oscillation frequency control input voltage to one of the transistors of the differential pair of transistors to adjust the oscillation frequency.

Example 8 can include, or can optionally be combined with the subject matter of one or any combination of Examples 5 through 7, to optionally include a pair of bipolar junction transistors as the differential pair of transistors.

Example 9 can include, or can optionally be combined with the subject matter of one or any combination of Examples 5 through 7, to optionally include, as the differential pair of transistors, a pair of field-effect transistors configured to operate in a weak inversion region.

Example 10 can include, or can optionally be combined with the subject matter of one or any combination of Examples 2 through 9, to optionally include a voltage-controlled resistance circuit, configured to directly or indirectly provide respective currents to the resistor and the capacitor to establish the oscillation frequency.

Example 11 can include, or can optionally be combined with the subject matter of one or any combination of Examples 1 through 10, to optionally include a voltage-controlled current circuit, including a diode-connected transistor configured to sink, from the supply voltage node, a current that is proportional to a magnitude of the supply voltage, and wherein the VCO output capacitor is charged using the current that is proportional to the magnitude of the supply voltage.

Example 12 can include, or can optionally be combined with the subject matter of Example 11 to optionally include the voltage-controlled current circuit, comprising a parallel circuit coupled to the resistor at a summing node, the parallel circuit configured to sink a current from the summing node in an amount substantially equal to a voltage between a source and a gate of the diode-connected transistor divided by a resistance of the resistor.

Example 13 can include, or can optionally be combined with the subject matter of one or any combination of Examples 1 through 12, to optionally include, in the VCO, a voltage divider coupled to the supply voltage node, wherein the specified threshold voltage is determined using a voltage received at a tap node in the voltage divider.

Example 14 can include, or can optionally be combined with the subject matter of Example 13 to optionally include a low pass filter configured to suppress a transient change in the voltage at the tap node due to a change in the supply voltage at the supply voltage node.

Example 15 can include, or can optionally be combined with the subject matter of one or any combination of Examples 1 through 14, to optionally include the discharge switch is configured to intermittently discharge the capacitor to provide a pulse-width modulated output voltage signal.

Example 16 can include, or can optionally be combined with the subject matter of one or any combination of Examples 1 through 15, to optionally include a switching power converter forward path including first and second switches, an inductor, and a converter output capacitor, wherein each of the first and second switches is controllably coupled to a respective driver circuit, and a converter output voltage is provided using the converter output capacitor, wherein the first switch is coupled to the supply voltage node of the VCO.

Example 17 can include, or can optionally be combined with the subject matter of Example 16 to optionally include the respective driver circuits are configured to operate in response to the oscillating output voltage from the VCO.

Example 18 can include, or can optionally be combined with the subject matter of one or any combination of Examples 1 through 17 to include, subject matter (such as an apparatus, a method, a means for performing acts, or a machine readable medium including instructions that, when performed by the machine, that can cause the machine to perform acts), such as can include a system, comprising a supply voltage node, configured to receive a supply voltage, a power converter forward path, including first and second switches, an inductor, and a first capacitor, wherein each of the first and second switches is controllably coupled to a respective driver circuit, wherein the first switch is coupled to the supply voltage node, and wherein a system output voltage is provided using the first capacitor, and a feedback path. In Example 18, the feedback path can include a pulse signal generator, including a phase detector and a voltage-controlled oscillator, wherein the voltage-controlled oscillator is configured to generate an oscillating output voltage comprising a pulse train, the pulse train comprising pulses having ramp slopes that are determined as a function of a magnitude of the supply voltage, and the oscillating output oscillating at a frequency determined by a signal from a phase detector. In Example 18, the feedback path can include a first comparator circuit, operable to provide an error voltage signal based on a comparison of a reference voltage and the system output voltage, and a second comparator circuit, operable to provide a control signal to the respective driver circuits based on a comparison of the error voltage signal and the oscillating output of the pulse signal generator.

Example 19 can include, or can optionally be combined with the subject matter of one or any combination of Examples 1 through 18 to include, subject matter (such as an apparatus, a method, a means for performing acts, or a machine readable medium including instructions that, when performed by the machine, that can cause the machine to perform acts), such as can include providing a ramped pulse signal using a voltage-controlled oscillator. Example 19 can include providing a first current to or from a supply through first and second circuit legs, generating a ramped pulse signal across a capacitor in the second circuit leg using a portion of the first current, providing a threshold voltage across a resistor in the first circuit leg using a portion of the first current, and controllably discharging the ramped pulse signal from the capacitor in response to a comparison of the capacitor voltage and the threshold voltage. In Example 19, the ramped pulse signal can be generated as a pulse having a slope that is a function of a value of the capacitor, of a value of the resistor, and of a voltage of the supply.

Example 20 can include, or can optionally be combined with the subject matter of Example 19 to optionally include mirroring a portion of the first current from the first circuit leg using a third circuit leg, the third circuit leg including a differential pair of transistors, adjusting a generating frequency of the ramped pulse signal across the capacitor using the differential pair of transistors to directly or indirectly provide a current to the capacitor to establish the oscillation frequency.

Example 21 can include, or can optionally be combined with the subject matter of one or any combination of Examples 1 through 20 to include, subject matter (such as an apparatus, a method, a means for performing acts, or a machine readable medium including instructions that, when performed by the machine, that can cause the machine to perform acts), such as can include first and second resistive divider networks with respective first and second tap nodes. The first and second resistive divider networks can have substantially similar divider ratios. Example 21 can optionally include a filter capacitor configured to influence the specified threshold voltage. Example 21 can optionally include a current source switchably coupled to the filter capacitor. Example 21 can optionally include a comparator circuit configured to provide a control signal to a switch that couples the current source to the filter capacitor.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus, comprising:
 a voltage-controlled oscillator (VCO), comprising:
  a supply voltage node, configured to receive a supply voltage;
  a VCO output capacitor, configured to provide an oscillating output voltage across the capacitor;
  a discharge switch, coupled in parallel with the capacitor, the discharge switch configured to discharge the capacitor according to a control signal;
 a first comparator circuit configured to provide the control signal to a control terminal of the discharge switch, the control signal determined based on a comparison of the oscillating output voltage and a specified threshold voltage; and
 a current steering circuit configured to directly or indirectly provide a first current to the capacitor to influence an oscillation frequency of the oscillating output voltage, and the first current is a function of a VCO control signal and a reference signal received by the current steering circuit;

wherein the oscillating output voltage includes a ramp pulse having a ramp slope that is determined as a function of a magnitude of the supply voltage and that is capable of being adjusted independently of the oscillation frequency of the oscillating output voltage.

2. The apparatus of claim 1, wherein the VCO comprises a resistor providing the specified threshold voltage across the resistor, and wherein the first comparator circuit is configured to compare the specified threshold voltage to the output voltage to operate the discharge switch to determine the output voltage slope as a function of the magnitude of the supply voltage, of a resistance of the resistor, and of a capacitance of the capacitor.

3. The apparatus of claim 2, comprising a voltage level shift circuit configured to receive the supply voltage and provide the specified threshold voltage referenced to and level-shifted from the supply voltage.

4. The apparatus of claim 3, wherein the voltage level shift circuit includes a diode-connected transistor.

5. The apparatus of claim 2, wherein the current steering circuit includes a differential pair of transistors configured with respective inputs arranged to compare the VCO control signal and the reference signal.

6. The apparatus of claim 5, comprising:
a current source/sink, configured to source or sink current to commonly connected source terminals of the differential pair of transistors; and
wherein a ratio of current provided in the current source/sink to a current provided to the capacitor determines the oscillation frequency.

7. The apparatus of claim 5, comprising a feedback circuit that includes the VCO, the feedback circuit including:
an input node coupled to receive and detect a frequency of the oscillating output voltage of the VCO;
a frequency-to-voltage converter circuit, configured to provide the VCO control signal determined based on the detected frequency of the oscillating output voltage and a reference frequency; and
an output node coupled to provide the VCO control signal to one of the transistors of the differential pair of transistors to adjust the oscillation frequency.

8. The apparatus of claim 5, wherein the differential pair of transistors includes a pair of bipolar junction transistors.

9. The apparatus of claim 5, wherein the differential pair of transistors includes a pair of field-effect transistors configured to operate in a weak inversion region.

10. The apparatus of claim 2, wherein the current steering circuit is configured to directly or indirectly provide respective currents to the resistor and the capacitor to establish the oscillation frequency.

11. The apparatus of claim 1, comprising a voltage-controlled current circuit, including a diode-connected transistor configured to sink, from the supply voltage node, a current that is proportional to a magnitude of the supply voltage, and wherein the VCO output capacitor is charged using the current that is proportional to the magnitude of the supply voltage.

12. The apparatus of claim 11, wherein the VCO comprises a resistor providing the specified threshold voltage across the resistor, and wherein the voltage-controlled current circuit comprises a parallel circuit coupled to the resistor at a summing node, the parallel circuit configured to sink a current from the summing node in an amount substantially equal to a voltage between a source and a gate of the diode-connected transistor divided by a resistance of the resistor.

13. The apparatus of claim 1, wherein the VCO comprises a voltage divider coupled to the supply voltage node, and wherein the specified threshold voltage is determined using a voltage received at a tap node in the voltage divider.

14. The apparatus of claim 13, comprising a low pass filter configured to suppress a transient change in the voltage at the tap node due to a change in the supply voltage at the supply voltage node.

15. The apparatus of claim 1, wherein the discharge switch is configured to intermittently discharge the capacitor to provide a pulse-width modulated output voltage signal.

16. The apparatus of claim 1, comprising a switching power converter forward path including first and second switches, an inductor, and a converter output capacitor, wherein each of the first and second switches is controllably coupled to a respective driver circuit, and a converter output voltage is provided using the converter output capacitor, wherein the first switch is coupled to the supply voltage node of the VCO.

17. The apparatus of claim 16, wherein the respective driver circuits are configured to operate in response to the oscillating output voltage from the VCO.

18. A system, comprising:
a supply voltage node, configured to receive a supply voltage;
a power converter forward path, including first and second switches, an inductor, and a first capacitor, wherein each of the first and second switches is controllably coupled to a respective driver circuit, wherein the first switch is coupled to the supply voltage node, and wherein a system output voltage is provided using the first capacitor; and
a feedback path, comprising:
a pulse signal generator, including a phase detector and a voltage-controlled oscillator, wherein the voltage-controlled oscillator is configured to generate an oscillating output voltage comprising a pulse train, the pulse train comprising pulses having ramp slopes that are determined as a function of a magnitude of the supply voltage, and the oscillating output oscillating at a frequency determined by a signal from a phase detector;
a first comparator circuit, operable to provide an error voltage signal based on a comparison of a reference voltage and the system output voltage; and
a second comparator circuit, operable to provide a control signal to the respective driver circuits based on a comparison of the error voltage signal and the oscillating output of the pulse signal generator.

19. A method to provide a ramped pulse signal using a voltage-controlled oscillator, comprising:
providing a first current to or from a supply through first and second circuit legs;
generating a ramped pulse signal across a capacitor in the second circuit leg using a portion of the first current;
providing a threshold voltage across a resistor in the first circuit leg using a portion of the first current; controllably discharging the ramped pulse signal from the capacitor in response to a comparison of the capacitor voltage and the threshold voltage;
mirroring a portion of the first current from the first circuit leg using a third circuit leg, the third circuit leg including a current steering circuit; and
adjusting a generating frequency of the ramped pulse signal across the capacitor using the current steering circuit to provide a current to the capacitor to establish the oscillation frequency;

wherein the ramped pulse signal is generated as a pulse having a slope that is a function of a value of the capacitor, of a value of the resistor, and of a voltage of the supply.

20. The method of claim 19, comprising: wherein the mirroring the portion of the first current from the first circuit leg using the third circuit leg includes using a differential pair of transistors to provide the current to the capacitor, the current magnitude based on a difference between a VCO control signal and a reference signal provided to respective ones of the transistors.

* * * * *